(12) United States Patent
Takaoka

(10) Patent No.: US 8,975,527 B2
(45) Date of Patent: Mar. 10, 2015

(54) CIRCUIT BOARD

(75) Inventor: Hidekiyo Takaoka, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 63 days.

(21) Appl. No.: 13/437,033

(22) Filed: Apr. 2, 2012

(65) Prior Publication Data

US 2012/0186860 A1    Jul. 26, 2012

Related U.S. Application Data

(63) Continuation of application No. PCT/JP2010/067415, filed on Oct. 5, 2010.

(30) Foreign Application Priority Data

Oct. 5, 2009  (JP) ................... 2009-231425

(51) Int. Cl.
H05K 1/00    (2006.01)
H05K 1/02    (2006.01)
H05K 3/46    (2006.01)

(52) U.S. Cl.
CPC ............ H05K 1/028 (2013.01); H05K 3/4691 (2013.01); H05K 3/4614 (2013.01); H05K 3/4632 (2013.01); H05K 2201/09036 (2013.01)
USPC ......................................... 174/254; 174/255

(58) Field of Classification Search
CPC ... H05K 1/028; H05K 3/4691; H05K 3/4614; H05K 2201/09036; H05K 3/4632; H05K 1/0281; H05K 1/189; H05K 5/003; H05K 3/0061; H05K 2201/2009; H05K 2201/09063; H05K 2201/09109; H05K 2201/09745; H05K 2201/09781
See application file for complete search history.

(56) References Cited

U.S. PATENT DOCUMENTS

| | | | | |
|---|---|---|---|---|
| 5,434,362 | A | * | 7/1995 | Klosowiak et al. ........... 174/254 |
| 5,516,989 | A | * | 5/1996 | Uedo et al. ................... 174/254 |
| 6,927,344 | B1 | * | 8/2005 | Gall et al. .................... 174/254 |
| 8,148,642 | B2 | * | 4/2012 | Bagung ........................ 174/254 |
| 2007/0277998 | A1 | | 12/2007 | Suzuki et al. |
| 2007/0281499 | A1 | | 12/2007 | Muro et al. |
| 2009/0242243 | A1 | | 10/2009 | Bagung |

FOREIGN PATENT DOCUMENTS

| | | |
|---|---|---|
| CN | 101547551 A | 9/2009 |
| JP | 60-101768 U | 7/1985 |
| JP | 64-002475 U | 1/1989 |

(Continued)

OTHER PUBLICATIONS

Official Communication issued in International Patent Application No. PCT/JP2010/067415, mailed on Dec. 28, 2010.

(Continued)

*Primary Examiner* — Ishwarbhai B Patel
(74) *Attorney, Agent, or Firm* — Keating & Bennett, LLP

(57) ABSTRACT

A circuit board prevents breakage at a boundary between a rigid region and a flexible region and includes a body including stacked flexible sheets, and rigid regions and a flexible region more flexible than the rigid regions. A circuit is defined by a conductor provided in the body. In the flexible region on a principal surface of the body, grooves are arranged to be in contact with boundaries between the flexible region and the rigid regions and to extend along the boundaries.

6 Claims, 7 Drawing Sheets

(56) References Cited

FOREIGN PATENT DOCUMENTS

| | | |
|---|---|---|
| JP | 03-011786 A | 1/1991 |
| JP | 2004-140171 A | 5/2004 |
| JP | 2007-324207 A | 12/2007 |
| JP | 2007-324208 A | 12/2007 |
| JP | 2008-004750 A | 1/2008 |
| JP | 2008-084968 A | 4/2008 |
| JP | 2008-251625 A | 10/2008 |
| JP | 2009-302343 A | 12/2009 |

OTHER PUBLICATIONS

Official Communication issued in corresponding Chinese Patent Application No. 201080045003.7, mailed on Apr. 2, 2014.

* cited by examiner

CIRCUIT BOARD

BACKGROUND OF THE INVENTION

1. Field of the Invention

The present invention relates to a circuit board, and more particularly, to a circuit board including a rigid region and a flexible region.

2. Description of the Related Art

As a conventional circuit board, for example, a printed wiring board described in Japanese Unexamined Patent Application Publication No. 2007-324208 is known. The printed wiring board will be described below with reference to the drawing. FIG. 14 is a cross-sectional structural view of a printed wiring board 500 described in Japanese Unexamined Patent Application Publication No. 2007-324208.

The printed wiring board 500 includes a first layer 510, a second layer 520, a flexible sheet 530, and conductor patterns 532a and 532b. The first layer 510 and the second layer 520 are stacked. The second layer 520 is partially cut out. The flexible sheet 530 is bonded to the first layer 510 in the cutout portion of the second layer 520. Thus, a region defined by the first layer 510 and the flexible sheet 530 (hereinafter referred to as a flexible region R503) becomes softer than regions where the first layer 510 and the second layer 520 are provided (hereinafter referred to as rigid regions R501 and R502). For this reason, the printed wiring board 500 can be bent at the flexible region R503.

Stress concentrates at boundaries between the rigid regions R501 and R502 and the flexible region R503 when the flexible region R503 is bent. More specifically, the hardness greatly changes at the boundaries between the rigid regions R501 and R502 and the flexible region R503. In this case, when the flexible region R503 is curved, portions of the flexible region R503 adjacent to the rigid regions R501 and R502 tend to curve with a small radius (that is, to be bent), and therefore, the portions may break. Accordingly, in the printed wiring board 500, the conductor patterns 532a and 532b are provided at the boundaries between the rigid regions R501 and R502 and the flexible region R503. This reinforces the boundaries between the rigid regions R501 and R502 and the flexible region R503.

The conductor patterns 532a and 532b are formed by metal films made of silver or copper, for example. While the conductor patterns 532a and 532b formed by the metal films have high rigidity, they plastically deform when bent with a small radius. The plastically deformed conductor patterns 532a and 532b no longer sufficiently function as reinforcing members. As a result, breakage may occur at the boundaries between the rigid regions R501 and R502 and the flexible region R503.

SUMMARY OF THE INVENTION

Accordingly, preferred embodiments of the present invention provide a circuit board that prevents breakage at boundaries between a rigid region and a flexible region.

A circuit board according to a preferred embodiment of the present invention includes a body including a plurality of stacked insulating layers and including a first region and a second region more flexible than the first region, and a circuit defined by a conductor provided in the body. In the second region on a principal surface of the body, a first groove is arranged to be in contact with a boundary between the first region and the second region and to extend along the boundary.

According to preferred embodiments of the present invention, it is possible to prevent breakage at the boundary between the rigid region and the flexible region.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

A circuit board according to preferred embodiments of the present invention will be described below with reference to the drawings.

Figure 1:
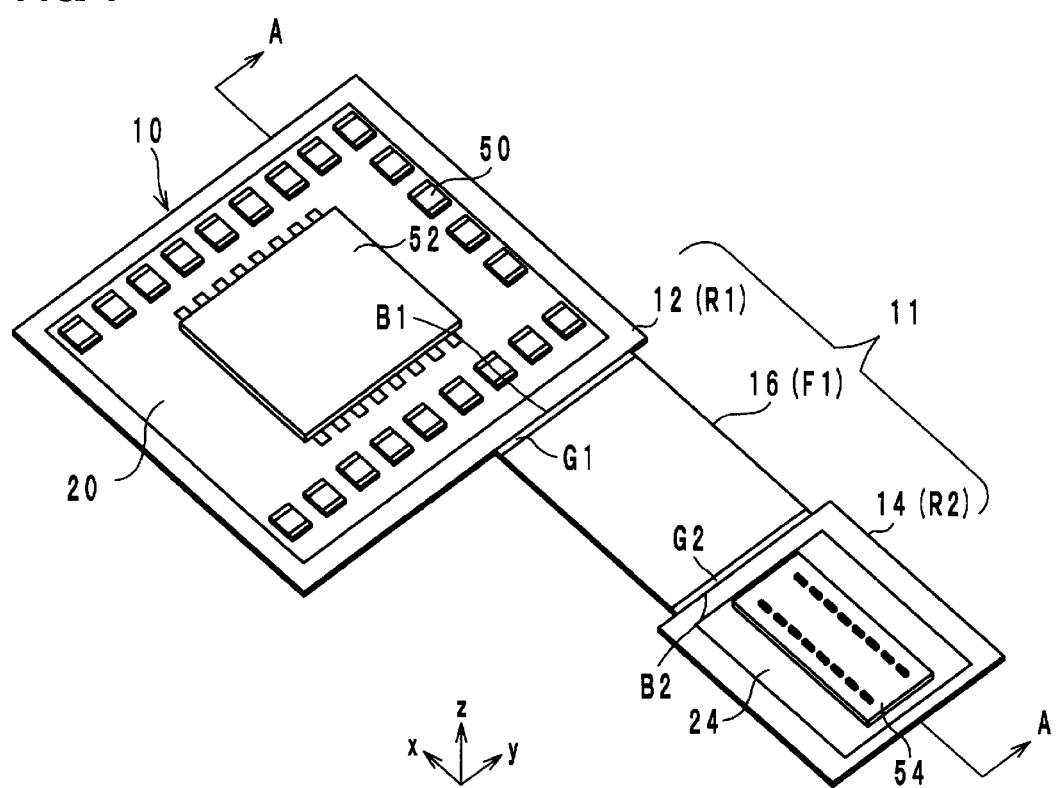
FIG. 1 is an external perspective view of a circuit board according to a preferred embodiment of the present invention.
Figure 2:
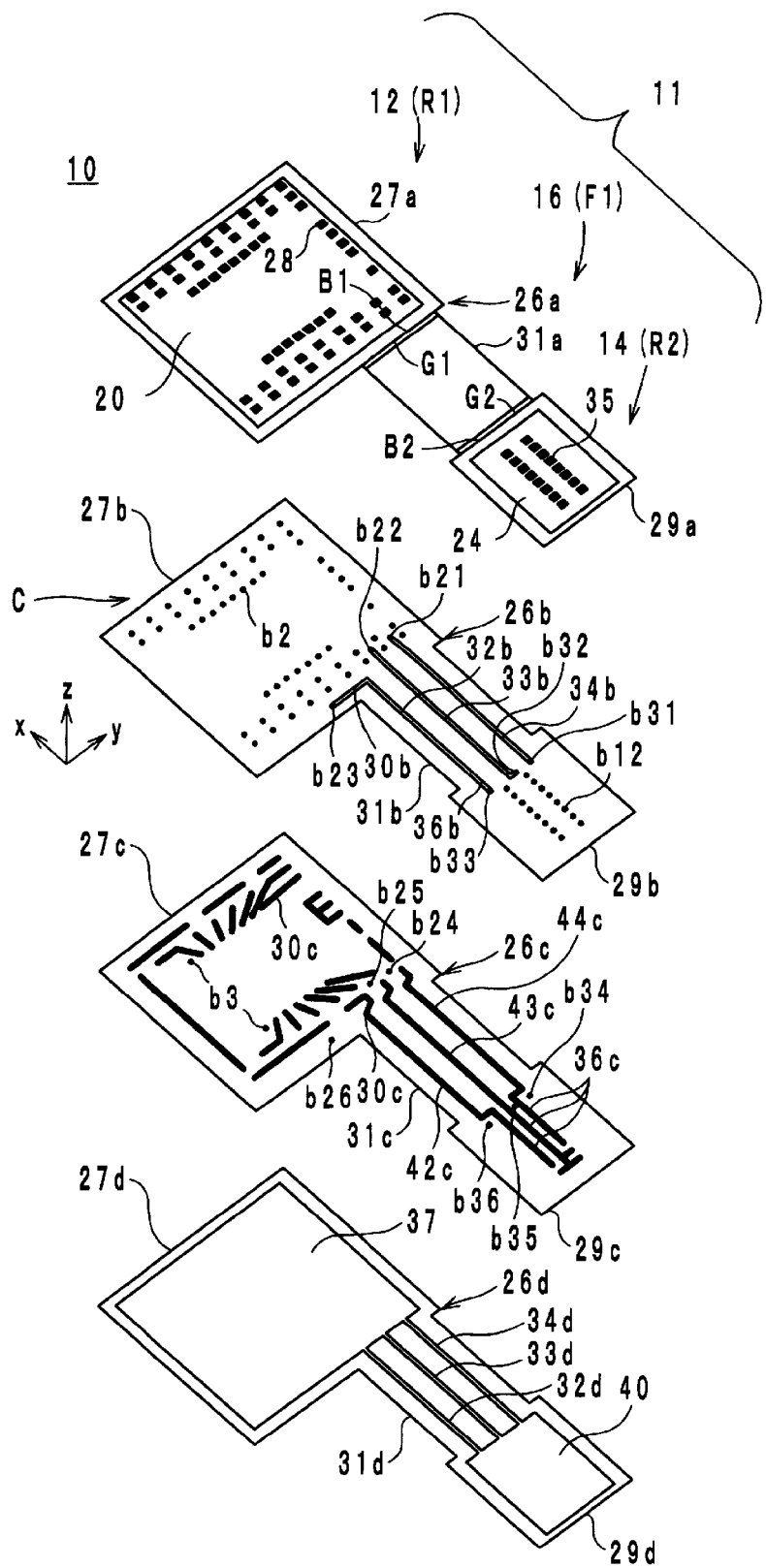
FIG. 2 is an exploded perspective view of the circuit board in FIG. 1.
Figure 3A:
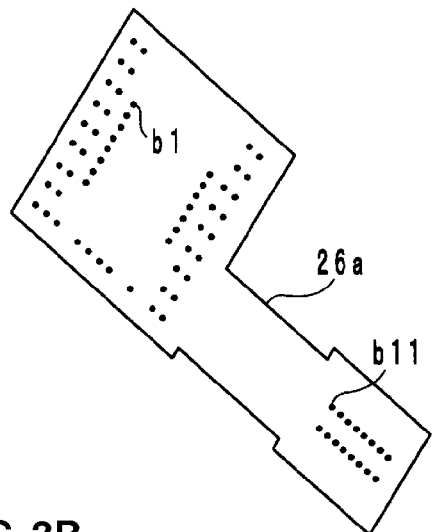
FIGS. 3A and 3B are perspective views illustrating a production procedure for a flexible sheet in the circuit board.
Figure 3B:
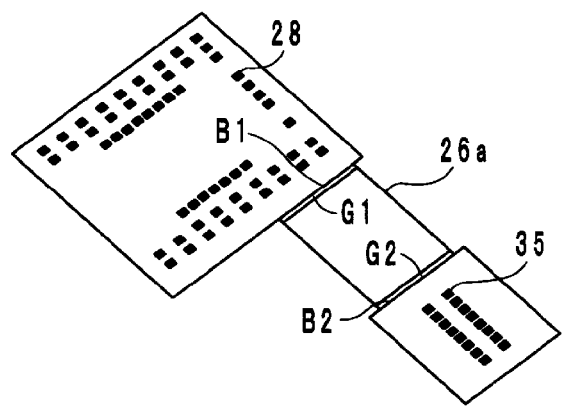

A structure of the circuit board according to a preferred embodiment of the present invention will be described below with reference to the drawings. FIG. 1 is an external perspective view of a circuit board 10 according to the present preferred embodiment of the present invention. FIG. 2 is an exploded perspective view of the circuit board 10 illustrated in FIG. 1. FIGS. 3A and 3B are perspective views illustrating a production procedure for a flexible sheet 26a in the circuit board 10. FIG. 3A illustrates a back surface of the flexible sheet 26a, and FIG. 3B illustrates a front surface of the flexible sheet 26a on which resist films 20 and 24 are not provided. In FIGS. 1 to 3B, a layer stacking direction of the circuit board 10 is defined as a z-axis direction, and a longitudinal direction of a line section 16 in the circuit board 10 is defined as an x-axis direction. A direction orthogonal to the x-axis direction and the z-axis direction is defined as a y-axis direction. Front surfaces of the circuit board 10 and flexible sheets 26 refer to surfaces located on a positive side in the z-axis direction, and back surfaces of the circuit board and the flexible sheets 26 refer to surfaces located on a negative side in the z-axis direction.

As illustrated in FIG. 1, the circuit board 10 includes a body 11 including substrate sections 12 and 14 and a line section 16, and a circuit C (not illustrated in FIG. 1) defined by conductors provided in the body 11.

As illustrated in FIG. 2, the body 11 is formed preferably by stacking a plurality of (for example, four in FIG. 2) flexible sheets preferably defined by insulating layers 26 including layers 26a to 26d made of a flexible material (e.g., thermoplastic resin such as a liquid crystal polymer). The substrate section 12 is preferably rectangular-shaped or substantially rectangular-shaped, and includes, on a front surface, a mount surface on which a plurality of chip components and an integrated circuit 52 are mounted. The substrate section 14 is preferably rectangular-shaped or substantially rectangular-shaped and smaller than the substrate section 12, and includes, on a front surface, a mount surface on which a connector 54 is mounted. The substrate sections 12 and 14 are resistant to deformation and bending so that the chip components 50, the integrated circuit 52, and the connector 54 can be stably mounted thereon. Accordingly, hereinafter, the substrate sections 12 and 14 are also referred to as rigid regions R1 and R2, respectively. The line section 16 connects the substrate section 12 and the substrate section 14. The circuit board 10 is used with the line section 16 being curved in a U-shape or substantially U-shape. Hence, the line section 16 is more flexible (e.g., more deformable and more bendable) than the substrate sections 12 and 14. Accordingly, hereinafter, the line section 16 is also referred to as a flexible region F1.

First, the substrate section 12 (rigid region R1) will be described. As illustrated in FIG. 2, the substrate section 12 is formed preferably by stacking substrate section sheets 27a to 27d of flexible sheets 26a to 26d. Further, as illustrated in FIGS. 1 to 3B, the substrate section 12 includes a resist film 20, lands 28, wiring conductors 30 (30b, 30c), a ground conductor 37, and via-hole conductors b1 to b3 and b21 to b26. In FIGS. 1 to 3B, only representative ones of the lands 28, the wiring conductors 30, and the via-hole conductors b1 to b3 are denoted by reference numerals in order to avoid complicated illustration.

The lands 28 are conductors that are provided in the body 11, more specifically, on a front surface of the substrate section sheet 27a, as illustrated in FIG. 2. The chip components 50 and the integrated circuit 52 are mounted on the lands 28 by soldering, as illustrated in FIG. 1.

As illustrated in FIG. 3A, the via-hole conductors b1 are arranged to penetrate the substrate section sheet 27a in the z-axis direction. Also, the via-hole conductors b1 are connected to the lands 28.

The wiring conductors 30b are conductors that are provided in the body 11, more specifically, on a front surface of the substrate section sheet 27b, as illustrated in FIG. 2. The via-hole conductors b2 are arranged to penetrate the substrate section sheet 27b in the z-axis direction, as illustrated in FIG. 2. Also, the via-hole conductors b2 are connected to the via-hole conductors b1. As illustrated in FIG. 2, the via-hole conductors b21 to b23 are arranged to penetrate the substrate section sheet 27b in the z-axis direction. Also, the via-hole conductors b21 to b23 are connected to the wiring conductors 30b.

The wiring conductors 30c are conductors that are provided in the body 11, more specifically, on a front surface of the substrate section sheet 27c, as illustrated in FIG. 2. The via-hole conductors b3 are arranged to penetrate the substrate section sheet 27c in the z-axis direction, as illustrated in FIG. 2. Also, the via-hole conductors b3 are connected to any of the via-hole conductors b2. As illustrated in FIG. 2, the via-hole conductors b24 to b26 are arranged to penetrate the substrate section sheet 27c in the z-axis direction. Also, the via-hole conductors b24 to b26 are connected to the via-hole conductors b21 to b23, respectively.

The ground conductor 37 preferably is one rectangular film electrode provided in the body 11, and more specifically, arranged to cover a front surface of the substrate section sheet 27d. However, as illustrated in FIG. 2, the ground conductor 37 does not cover the entire surface of the substrate section sheet 27d, and is not provided near the outer periphery of the substrate section sheet 27d. Further, the ground conductor 37 is grounded to be kept at a ground potential. The ground conductor 37 is connected to the via-hole conductors b3 and b24 to b26. As described above, the wiring conductors 30b and 30c, the ground conductor 37, and the via-hole conductors b1 to b3 and b21 to b26 are connected to define a circuit by stacking the substrate section sheets 27a to 27d.

The resist film 20 is an insulating film that covers the front surface of the substrate section sheet 27a to protect the substrate section sheet 27a. The resist film 20 is not provided on the lands 28. The resist film 20 preferably is formed of a material having a low solder wettability, and for example, is formed by application of thermosetting resin (e.g., epoxy resin).

Next, the substrate section 14 (rigid region R2) will be described. As illustrated in FIG. 2, the substrate section 14 is formed preferably by stacking substrate section sheets 29a to 29d of the flexible sheets 26a to 26d. Further, as illustrated in FIGS. 1 to 3B, the substrate section 14 includes a resist film 24, lands 35, wiring conductors 36 (36b, 36c), a ground conductor 40, and via-hole conductors b11, b12, and b31 to b36. In FIGS. 1 to 3B, only representative ones of the lands 35, the wiring conductors 36, and the via-hole conductors b11 and b12 are denoted by reference numerals in order to avoid complicated illustration.

The lands 35 are conductors provided in the body 11, more specifically, provided on a front surface of the substrate section sheet 29a, as illustrated in FIG. 2. On the lands 35, the connector 54 is mounted by soldering, as illustrated in FIG. 1.

As illustrated in FIG. 3A, the via-hole conductors b11 are provided to penetrate the substrate section sheet 29a in the z-axis direction. Further, the via-hole conductors b11 are connected to the lands 35.

The wiring conductors 36b are conductors provided in the body 11, more specifically, provided on a front surface of the substrate section sheet 29b, as illustrated in FIG. 2. The via-hole conductors b12 are arranged to penetrate the substrate section sheet 29b in the z-axis direction, as illustrated in FIG. 2. Also, the via-hole conductors b12 are connected to the via-hole conductors b11. The via-hole conductors b31 to b33 are arranged to penetrate the substrate section sheet 29b in the z-axis direction, as illustrated in FIG. 2. Also, the via-hole conductors b31 to b33 are connected to the wiring conductors 36b.

The wiring conductors 36c are conductors provided in the body 11, more specifically, provided on a front surface of the substrate section sheet 29c, as illustrated in FIG. 2. The wiring conductors 36c are connected to the via-hole conductors b12. As illustrated in FIG. 2, the via-hole conductors b34 to b36 are arranged to penetrate the substrate section sheet 29c in the z-axis direction. Also, the via-hole conductors b34 to b36 are connected to the via-hole conductors b31 to b33.

The ground conductor 40 preferably is one rectangular film electrode provided in the body 11, and more specifically, is arranged provided to cover a front surface of the substrate section sheet 29d. However, as illustrated in FIG. 2, the ground conductor 40 does not cover the entire surface of the substrate section sheet 29d, and is not provided near the outer periphery of the substrate section sheet 29d. The ground conductor 40 is grounded to be kept at a ground potential. The ground conductor is connected to the via-hole conductors b34 to b36. As described above, the wiring conductors 36b and 36c, the ground conductor 40, and the via-hole conductors b11, b12 and b31 to b36 are connected to define a circuit by stacking the substrate section sheets 29a to 29d.

The resist film 24 is an insulating film that covers the front surface of the substrate section sheet 29a to protect the substrate section sheet 29a. However, the resist film 24 is not provided on the lands 35. The resist film 24 is preferably formed of a material having a low solder wettability, and for example, is formed by application of thermosetting resin (e.g., epoxy resin).

Next, the line section 16 (flexible region F1) will be described. As illustrated in FIG. 2, the line section 16 is formed preferably by stacking line section sheets 31a to 31d of the flexible sheets 26a to 26d. As illustrated in FIGS. 1 and 2, the line section 16 includes ground lines 32 (32b, 32d), 33 (33b, 33d), and 34 (34b, 34d) and signal lines 42c, 43c, and 44c.

The signal lines 42c, 43c, and 44c are provided in the body 11, and more specifically, are provided in the line section to extend between the substrate sections 12 and 14. As illustrated in FIG. 2, the signal lines 42c, 43c, and 44c are linear conductors provided on a front surface of the line section sheet 31c. A high-frequency signal (e.g., about 800 MHz to about 900 MHz) is transmitted to the signal lines 42c, 43c, and 44c. As illustrated in FIG. 2, the signal lines 42c, 43c, and 44c connect the wiring conductors 30c and the wiring conductors 36c. That is, conductors defined by the wiring conductors 30c and 36c and the signal lines 42c, 43c, and 44c extend over the rigid regions R1 and R2 and the flexible region F1.

The ground lines 32b, 33b, and 34b are provided in the body 11, and more specifically, provided in the line section 16 to be located on a positive side of the signal lines 42c, 43c, and 44c in the z-axis direction. As illustrated in FIG. 2, the ground lines 32b, 33b, and 34b are provided on a front surface of the line section sheet 31b, and connect the wiring conductors 30b and the wiring conductors 36b. That is, conductors defined by the wiring conductors 30b and 36b and the ground lines 32b, 33b, and 34b extend over the rigid regions R1 and R2 and the flexible region F1. Further, the wiring conductors 30b are connected to the ground conductor 37 through the via-hole conductors b21 to b26. The wiring conductors 36b are connected to the ground conductor 40 through the via-hole conductors b31 to b36. Accordingly, the ground lines 32b, 33b, and 34b are electrically connected to the ground conductor 37. Also, the ground lines 32b, 33b, and 34b are electrically connected to the ground conductor 40.

As illustrated in FIG. 2, the ground lines 32b, 33b, and 34b have a line width larger than that of the signal lines 42c, 43c, and 44c. Thus, in plan view in the z-axis direction, the signal lines 42c, 43c, and 44c are aligned with the ground lines 32b, 33b, and 34b without protruding therefrom.

The ground lines 32d, 33d, and 34d are provided in the line section 16, and are located on a negative side of the signal lines 42c, 43c, and 44c in the z-axis direction. More specifically, as illustrated in FIG. 2, the ground lines 32d, 33d, and 34d are provided on a front surface of the line section sheet 31d, and connect the ground conductor 37 and the ground conductor 40. That is, conductors defined by the ground conductors 37 and 40 and the ground lines 32d, 33d, and 34d extend over the rigid regions R1 and R2 and the flexible region F1.

As illustrated in FIG. 2, the ground lines 32d, 33d, and 34d have a line width larger than that of the signal lines 42c, 43c, and 44c. Thus, in plan view in the z-axis direction, the signal lines 42c, 43c, and 44c are aligned with the ground lines 32d, 33d, and 34d without protruding therefrom.

As described above, the ground lines 32b, 33b, and 34b, the signal lines 42c, 43c, and 44c, and the ground lines 32d, 33d, and 34d are aligned with one another. Thus, the ground line 32b, the signal line 42c, and the ground line 32d constitute a strip line. Similarly, the ground line 33b, the signal line 43c, and the ground line 33d constitute a strip line. The ground line 34b, the signal line 44c, and the ground line 34d constitute a strip line. As a result, impedance matching is achieved between the circuit in the substrate section 12 and the circuit in the substrate section 14. The circuit in the substrate section 12, the circuit in the substrate section 14, and the strip lines in the line section 16 constitute the circuit C.

In the above-described circuit board 10, in plan view in the z-axis direction, the ratio of an area occupied by the conductors in the rigid regions R1 and R2 is preferably set to be higher than the ratio of an area occupied by the conductors in the flexible region F1. More specifically, as illustrated in FIG. 2, in plan view in the z-axis direction, the rigid regions R1 and R2 include the ground conductors 37 and 40 that cover almost the entire surfaces thereof. In contrast, the flexible region F1 does not include a conductor that covers almost the entire surface thereof, but includes the ground lines 32b, 32d, 33b, 33d, 34b, and 34d extending in the x-axis direction. The ground conductors 37 and 40 are harder than the flexible sheets 26. Hence, in plan view in the z-axis direction, when the ratio of area occupied by the conductors in the rigid regions R1 and R2 is preferably set to be higher than the ratio of area occupied by the conductors in the flexible region F1, the flexible region F1 can more easily deform than the rigid regions R1 and R2.

Figure 4:
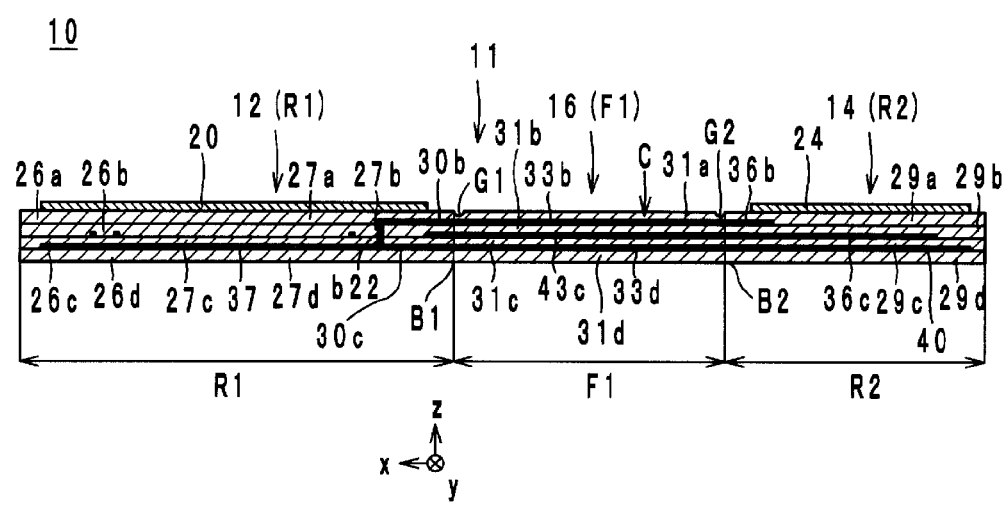
FIG. 4 is a cross-sectional structural view of the circuit board, taken along line A-A in FIG. 1.

The circuit board 10 has a structure that prevents the occurrence of breakage at boundaries B1 and B2 between the rigid regions R1 and R2 and the flexible region F1. This structure will be described below with reference to FIG. 4. FIG. 4 is a cross-sectional structural view of the circuit board 10, taken along line A-A in FIG. 1.

As described above, the circuit board 10 includes the rigid regions R1 and R2 and the flexible region F1. Between the rigid regions R1 and R2 and the flexible region F1, the boundaries B1 and B2 extend in the y-axis direction. As illustrated in FIG. 4, in the flexible region F1 on a principal surface of the body 11, grooves G1 and G2 are provided in contact with the boundaries B1 and B2 between the rigid regions R1 and R2 and the flexible region F1, and extend along the boundaries B1 and B2, respectively. More specifically, as illustrated in FIGS. 2 and 4, the grooves G1 and G2 extend in the y-axis direction at opposite ends in the x-axis direction of the line section sheet 31a located closest to the positive side in the z-axis direction, among the line section sheets 31a to 31d. The grooves G1 and G2 are formed preferably by recessing a principal surface of the line section sheet 31a on the positive side in the z-axis direction. Thus, the circuit board 10 has a structure that is thinner in the z-axis direction in portions of the flexible region F1 adjacent to the boundaries B1 and B2 than in the other portions of the flexible region F1.

The circuit board 10 having the above-described structure is used in a state in which the flexible region F1 is curved in a U-shape or substantially U-shape such that the line section sheet 31a is located on an outer peripheral side and the line section sheet 31d is located on an inner peripheral side.

A non-limiting example of a production method for the circuit board 10 will be described below with reference to the drawings. While a case in which one circuit board 10 is produced will be described below, in actuality, a plurality of circuit boards 10 preferably are simultaneously produced by stacking and cutting large-sized flexible sheets.

First, a plurality of flexible sheets 26, whose front surfaces are each entirely covered with a copper foil of 5 μm to 50 μm in thickness, are prepared. Among the flexible sheets 26, the flexible sheet 26a includes grooves G1 and G2. The grooves G1 and G2 may be formed when shaping the flexible sheet 26a, or may be formed by compressing a portion of the flexible sheet 26a after shaping the flexible sheet 26a.

Next, via holes are formed by applying a laser beam, from a back surface side, onto positions of the flexible sheets 26a to 26c where via-hole conductors b1 to b3, b11, b12, b21 to b26, and b31 to b36 are to be formed (see FIGS. 2 and 3A).

Next, lands 28 and 35 illustrated in FIG. 3B are formed on the front surface of the flexible sheet 26a by a photolithography process. More specifically, resists having the same shape as that of the lands 28 and 35 illustrated in FIG. 3B are printed on the copper foil of the flexible sheet 26a. Then, etching is conducted on the copper foil to remove the copper foil from portions that are not covered with the resists. After that, the resists are removed. Thus, the lands 28 and 35 illustrated in FIG. 3B are formed on the front surface of the flexible sheet 26a. Further, resist films 20 and 24 illustrated in FIGS. 1 and 2 are formed by applying resin onto the front surface of the flexible sheet 26a.

Next, wiring conductors 30b and 36b and ground lines 32b, 33b, and 34b illustrated in FIG. 2 are formed on a front surface of the flexible sheet 26b by a photolithography process. Further, wiring conductors 30c and 36c and signal lines 42c, 43c, and 44c illustrated in FIG. 2 are formed on a front surface of the flexible sheet 26c by a photolithography process. In addition, ground lines 32d, 33d, and 34d and ground conductors 37 and 40 illustrated in FIG. 2 are formed on a front surface of the flexible sheet 26d by a photolithography process. Since these photolithography processes are similar to the photolithography process for forming the lands 28 and 35, descriptions thereof are skipped.

Next, the via holes formed in the flexible sheets 26a to 26c are filled with a conductive paste containing copper as a major component so as to form via-hole conductors b1 to b3, b11, b12, b21 to b26, and b31 to b36 illustrated in FIGS. 2 and 3A. Through the above-described steps, the flexible sheets 26a to 26d are prepared which are formed of a flexible material and include a circuit C. The circuit C is preferably constituted by the wiring conductors 30b, 30c, 36b, and 36c, the ground conductors 37 and 40, the via-hole conductors b1 to b3, b11, b12, b21 to b26, and b31 to b36, the ground lines 32b, 33b, 34b, 32d, 33d, and 34d, and the signal lines 42c, 43c, and 44c, for example.

Finally, the flexible sheets 26a to 26d are stacked in this order. The flexible sheets 26a to 26d are pressurized from both sides in the z-axis direction and are heated. Thus, the flexible sheets 26a to 26d are pressure-bonded. Through the above-described steps, the circuit board 10 illustrated in FIG. 1 is obtained.

Figure 5A:
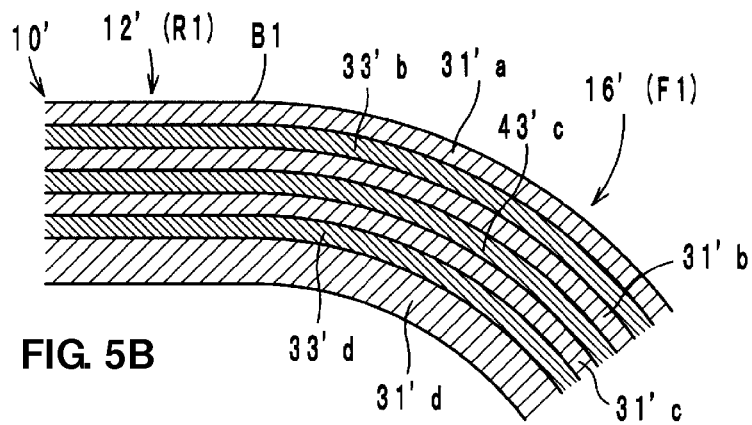
FIG. 5A is a cross-sectional structural view of a circuit board as a comparative example.
Figure 5B:
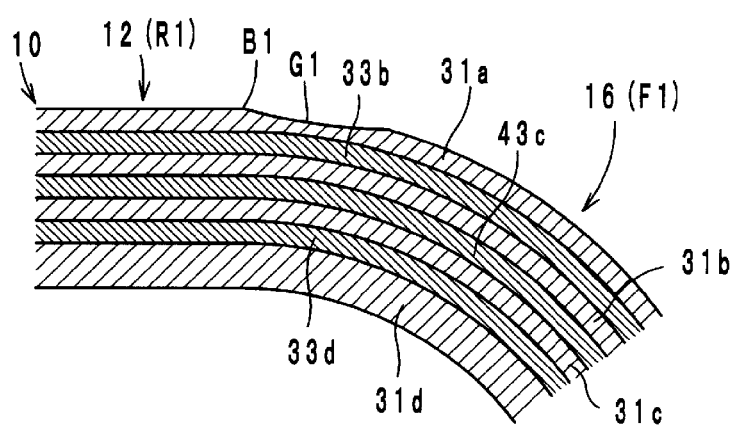
FIG. 5B is a cross-sectional structural view of the circuit board of a preferred embodiment of the present invention.

As will be described below, the circuit board 10 prevents breakage at the boundaries between the rigid regions R1 and R2 and the flexible region F1. FIG. 5A is a cross-sectional structural view of a circuit board 10' as a comparative example, and FIG. 5B is a cross-sectional structural view of the circuit board 10 of the present preferred embodiment. In the circuit board 10', the same structures as those adopted in the circuit board 10 are denoted by the same reference numerals marked with "'".

As illustrated in FIG. 5A, the circuit board 10' is different from the circuit board 10 in that grooves G1 and G2 are not provided. In the circuit board 10', when a flexible region F1 is curved, tensile stress acts on line section sheets 31'a and 31'b located on the outer peripheral side, and compressive stress acts on line section sheets 31'c and 31'd located on the inner peripheral side. For this reason, the line section sheets 31'a and 31'b expand, and the line section sheets 31'c and 31'd contract. In particular, the line section sheet 31'a is greatly expanded by a tensile stress more than a tensile stress for the line section sheet 31'b. In a portion of the flexible region F1 near a boundary B1, the hardness of a body 11 changes rapidly. For this reason, the portion of the flexible region F1 near the boundary B1 is curved with a small radius. As a result, a particularly great tensile stress acts on a portion of the line section sheet 31'a near the boundary B1, and this may break the portion of the line section sheet 31'a near the boundary B1. According to a similar principle, the line section sheet 31'a may also break near a boundary B2.

Accordingly, in the circuit board 10, the flexible region F1 includes the grooves G1 and G2 that are in contact with the boundaries B1 and B2 between the rigid regions R1 and R2 and the flexible region F1 and that extend along the boundaries B1 and B2, as illustrated in FIG. 4. In particular, the grooves G1 and G2 are provided in the line section sheet 31a located on the outermost peripheral side in the circuit board 10. When the flexible region F1 is curved, the portions of the line section sheet 31a near the boundaries B1 and B2 are most likely to break because tensile stress concentrates thereat. Hence, extreme stress concentration near the boundaries B1 and B2 can be prevented by forming the grooves G1 and G2. When the flexible region F1 is curved, the grooves G1 and G2 (the groove G2 is not illustrated) expand, as illustrated in FIG. 5B, and the stress disperses. Thus, the circuit board 10 prevents the occurrence of breakage at the boundaries between the rigid regions R1 and R2 and the flexible region F1.

Figure 6:
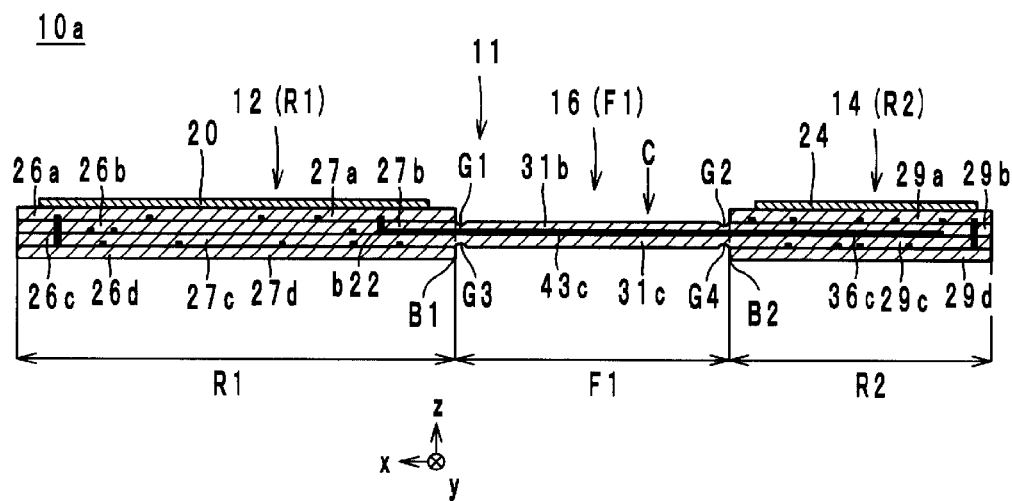
FIG. 6 is a cross-sectional structural view of a circuit board according to a first modification of a preferred embodiment of the present invention.
Figure 7:
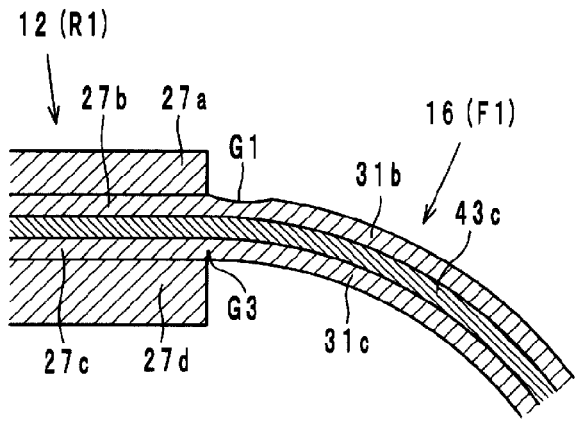
FIG. 7 is a cross-sectional structural view of the circuit board of the first modification of a preferred embodiment of the present invention.

A circuit board according to a first modification of a preferred embodiment of the present invention will be described below with reference to the drawings. FIGS. 6 and 7 are cross-sectional structural views of a circuit board 10a according to the first modification.

In the circuit board 10a, the number of flexible sheets 26 in rigid regions R1 and R2 (for example, four sheets in FIG. 6) is more than the number of flexible sheets 26 in a flexible region F1 (for example, two sheets in FIG. 6). At boundaries B1 and B2 between the rigid regions R1 and R2 and the flexible region F1, stepped portions are provided.

Further, in the circuit board 10a, grooves G1 and G2 are provided at opposite ends of a line section sheet 31b in the x-axis direction, and grooves G3 and G4 are provided at opposite ends of a line section sheet 31c in the x-axis direction.

Since the above-described circuit board 10a includes the grooves G1 and G2, it prevents breakage at the boundaries between the rigid regions R1 and R2 and the flexible region F1, similarly to the circuit board 10.

Further, the circuit board 10a prevents separation of the line section sheet 31c from the line section sheet 31b, as will be described below. More specifically, when the flexible region F1 is curved, the line section sheet 31c is contracted by compressive stress. In this case, when the line section sheet 31c does not withstand the compressive stress, it tends to buckle toward the inner peripheral side to separate from the line section sheet 31b.

Accordingly, in the circuit board 10a, the grooves G3 and G4 are provided near the boundaries B1 and B2 in the line section sheet 31c located on the inner peripheral side. Thus, when the line section sheet 31c is compressed, it deforms so that the width of the grooves G3 and G4 in the x-axis direction decreases, as illustrated in FIG. 7. As a result, the compressive stress applied to the line section sheet 31c is reduced, and separation of the line section sheet 31c from the line section sheet 31b is prevented. That is, from this viewpoint, the circuit board 10a also prevents breakage at the boundaries between the rigid regions R1 and R2 and the flexible region F1.

Further, the circuit board 10a prevents separation of substrate section sheets 27a and 29a from substrate section sheets 27b and 29b, as will be described below. More specifically, when the flexible region F1 is curved, the substrate section sheets 27b and 29b are pulled and slightly curved by the line section sheet 31b. Since the substrate section sheets 27a and 29a are bonded to the substrate section sheets 27b and 29b, they are pulled by the substrate section sheets 27b and 29b and are slightly deformed to follow deformation of the substrate section sheets 27b and 29b. However, if the flexible region F1 is curved with a small radius, the substrate section sheets 27a and 29a cannot follow deformation of the substrate section sheets 27b and 29b. As a result, the substrate section sheets 27a and 29a tend to separate from the substrate section sheets 27b and 29b.

Accordingly, the line section sheet 31b is provided with the grooves G1 and G2 in the circuit board 10a. Since this reduces the thickness in the z-axis direction of the flexible region F1 near the boundaries B1 and B2, the flexible region F1 easily deforms. As a result, the force of the line section sheet 31b for pulling the substrate section sheets 27b and 29b when the flexible region F1 is curved decreases. Hence, the deformation amount of the substrate section sheets 27b and 29b is reduced, and the substrate section sheets 27a and 29a are prevented from separating from the substrate section sheets 27b and 29b which may occur when they cannot follow deformation of the substrate section sheets 27b and 29b. That is, from this viewpoint, the circuit board 10a also prevents breakage at the boundaries between the rigid regions R1 and R2 and the flexible region F1.

Figure 8:
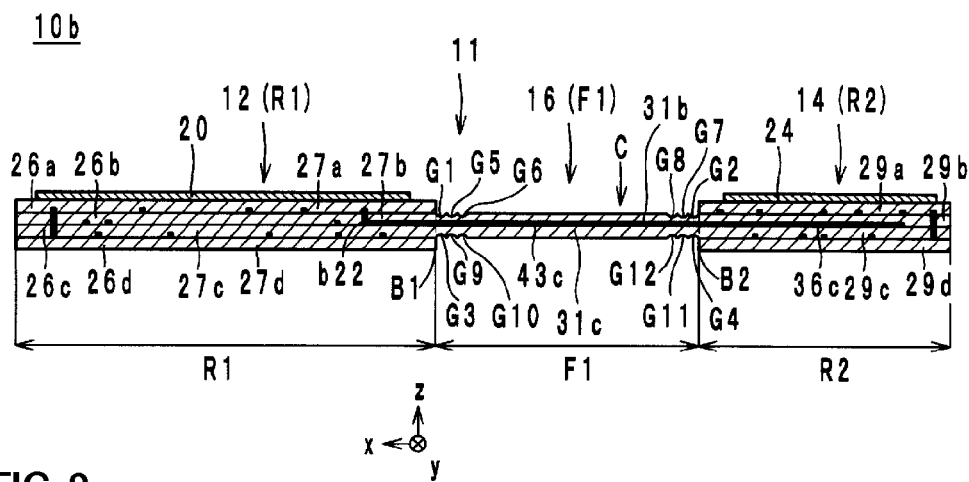
FIG. 8 is a cross-sectional structural view of a circuit board according to a second modification of a preferred embodiment of the present invention.

A circuit board according to a second modification of a preferred embodiment of the present invention will be described below with reference to the drawings. FIG. 8 is a cross-sectional structural view of a circuit board 10b according to the second modification.

The circuit board 10b further includes grooves G5 to G12, in contrast to the circuit board 10a. More specifically, the groove G5 is adjacent to a negative side of a groove G1 in the x-axis direction, and extends parallel or substantially parallel to the groove G1. The groove G6 is adjacent to a negative side of the groove G5 in the x-axis direction, and extends parallel or substantially parallel to the groove G1. The groove G7 is adjacent to a positive side of a groove G2 in the x-axis direction, and extends parallel or substantially parallel to the groove G2. The groove G8 is adjacent to a positive side of the groove G7 in the x-axis direction, and extends parallel or substantially parallel to the groove G2. The groove G9 is adjacent to a negative side of a groove G3 in the x-axis direction, and extends parallel or substantially parallel to the groove G3. The groove G10 is adjacent to a negative side of the groove G9 in the x-axis direction, and extends parallel or substantially parallel to the groove G3. The groove G11 is adjacent to a positive side of a groove G4 in the x-axis direction, and extends parallel or substantially parallel to the groove G4. The groove G12 is adjacent to a positive side of the groove G11 in the x-axis direction, and extends parallel or substantially parallel to the groove G4.

Since the above-described circuit board 10b includes the grooves G5 to G12 in addition to the grooves G1 to G4, it more effectively prevents breakage of a line section sheet 31b, and more effectively prevents separation of a line section sheet 31c from the line section sheet 31b. Further, the circuit board 10b more effectively prevents separation of substrate section sheets 27a and 29a from substrate section sheets 27b and 29b. That is, the circuit board 10b prevents breakage at the boundaries between rigid regions R1 and R2 and a flexible region F1.

Figure 9:
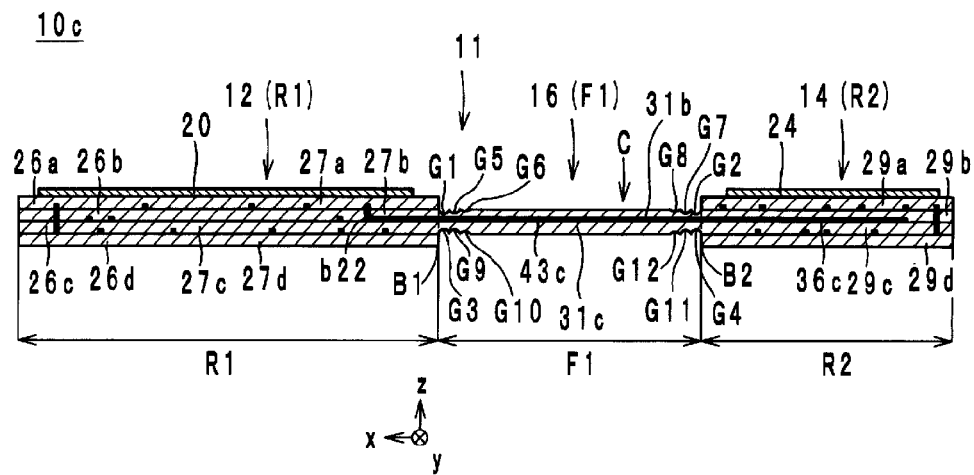
FIG. 9 is a cross-sectional structural view of a circuit board according to a third modification of a preferred embodiment of the present invention.

A circuit board according to a third modification of a preferred embodiment of the present invention will be described below with reference to the drawings. FIG. 9 is a cross-sectional structural view of a circuit board 10c according to the third modification.

A flexible region F1 is curved with a small radius near boundaries B1 and B2. For this reason, it is preferable that portions of the flexible region F1 near the boundaries B1 and B2 should be deformed more easily. Accordingly, grooves G1 to G4 in contact with the boundaries B1 and B2 are deeper than grooves G5 to G12 in the circuit board 10c. The grooves G5 to G12 decrease in depth away from the boundaries B1 and B2. Thus, ease of deformation of the flexible region F1 increases toward the boundaries B1 and B2. As a result, the circuit board 10c more effectively prevents breakage of line section sheets 31b and 31c, and more effectively prevents separation of the line section sheet 31c from the line section sheet 31b. Further, the circuit board 10c more effectively prevents separation of substrate section sheets 27a and 29a from substrate section sheets 27b and 29b. That is, the circuit board 10c prevents breakage at the boundaries between rigid regions R1 and R2 and the flexible region F1.

Figure 10:
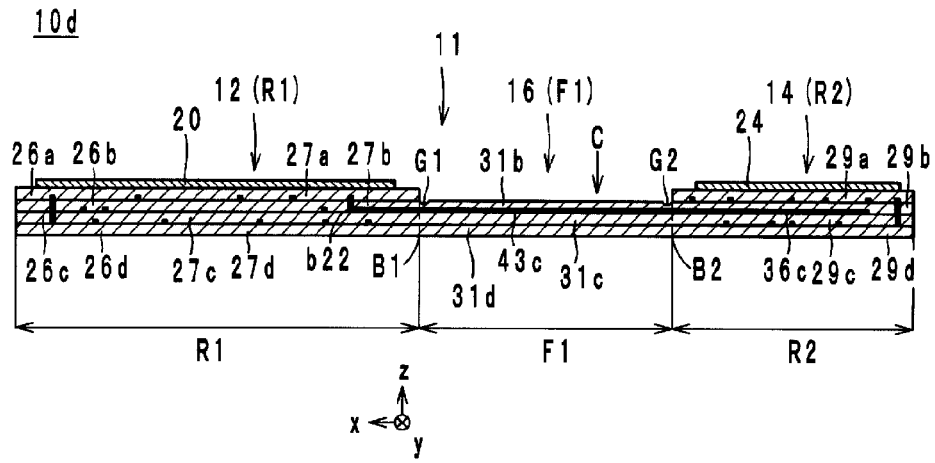
FIG. 10 is a cross-sectional structural view of a circuit board according to a fourth modification of a preferred embodiment of the present invention.

A circuit board according to a fourth modification of a preferred embodiment of the present invention will be described below with reference to the drawings. FIG. 10 is a cross-sectional structural view of a circuit board 10d according to the fourth modification.

In the circuit boards 10a to 10c, stepped portions are provided on both principal surfaces of the body 11. In contrast, in the circuit board 10d, stepped portions are provided on only a principal surface of a body 11 on a positive side in the z-axis direction. That is, a line section sheet 31d is provided in the circuit board 10d, in contrast to the circuit boards 10a to 10c in which the line section sheet 31d is not provided. Further, grooves G1 and G2 are provided in a line section sheet 31b.

The circuit board 10d also more effectively prevents breakage of the line section sheet 31b, and more effectively prevents separation of substrate section sheets 27a and 29a from substrate section sheets 27b and 29b. That is, the circuit board 10d prevents breakage at the boundaries between rigid regions R1 and R2 and a flexible region F1.

Figure 11:
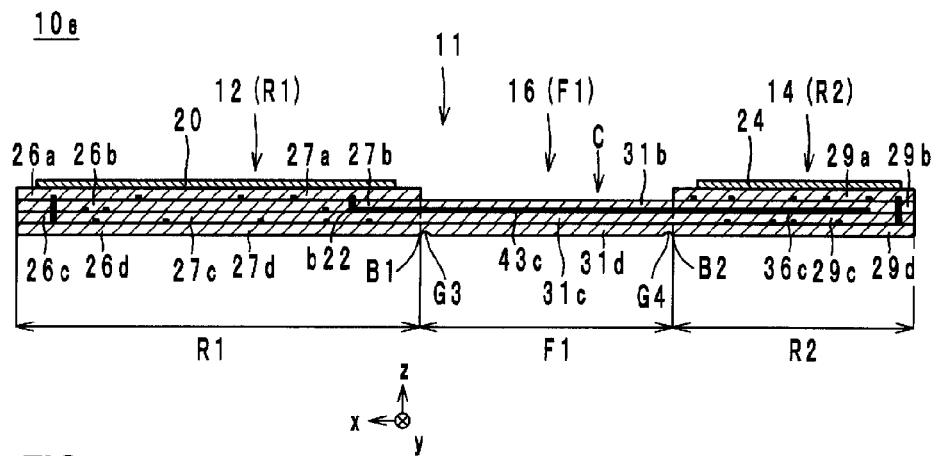
FIG. 11 is a cross-sectional structural view of a circuit board according to a fifth modification of a preferred embodiment of the present invention.

A circuit board according to a fifth modification of a preferred embodiment of the present invention will be described below with reference to the drawings. FIG. 11 is a cross-sectional structural view of a circuit board 10e according to the fifth modification.

In the circuit board 10d, the grooves G1 and G2 are provided in the line section sheet 31b. In contrast, in the circuit board 10e, grooves G3 and G4 are provided in a line section sheet 31d.

The circuit board 10e also more effectively prevents separation of the line section sheet 31d from a line section sheet 31c. That is, the circuit board 10e prevents breakage at boundaries between rigid regions R1 and R2 and a flexible region F1.

Figure 12:
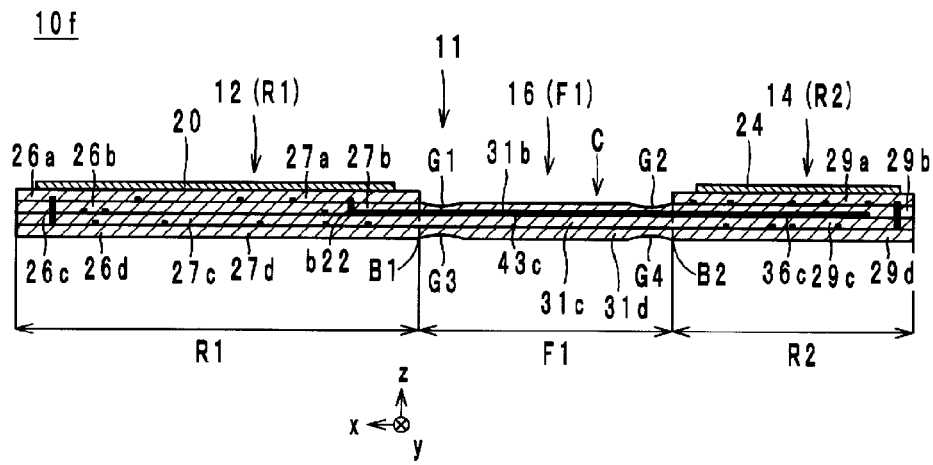
FIG. 12 is a cross-sectional structural view of a circuit board according to a sixth modification of a preferred embodiment of the present invention.

A circuit board according to a sixth modification of a preferred embodiment of the present invention will be described below with reference to the drawings. FIG. 12 is a cross-sectional structural view of a circuit board 10f according to the sixth modification.

Grooves G1 and G2 in the circuit board 10f are wider in the x-axis direction than the grooves G1 and G2 in the circuit board 10d. The circuit board 10f having this structure also more effectively prevents breakage of a line section sheet 31b, and more effectively prevents separation of a line section sheet 31d from a line section sheet 31c. Further, the circuit board 10f more effectively prevents separation from substrate section sheets 27a and 29a from substrate section sheets 27b and 29b. That is, the circuit board 10f prevents breakage at boundaries between rigid regions R1 and R2 and a flexible region F1.

Figure 13:
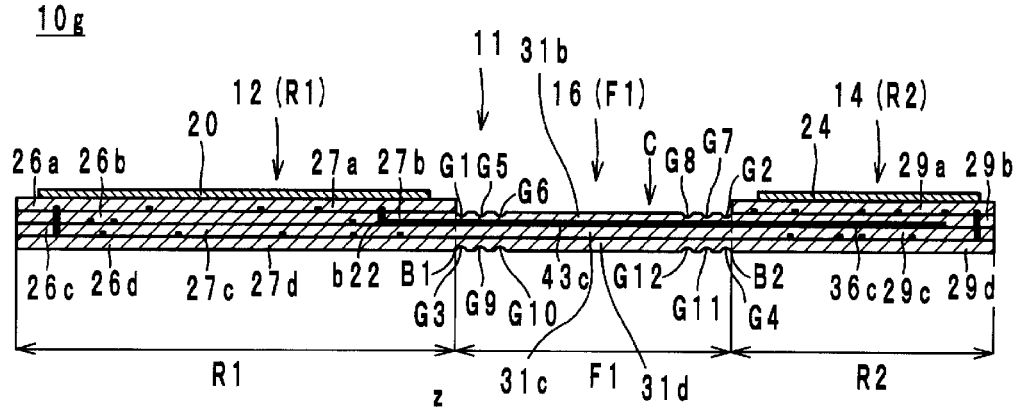
FIG. 13 is a cross-sectional structural view of a circuit board according to a seventh modification of a preferred embodiment of the present invention.
Figure 14:
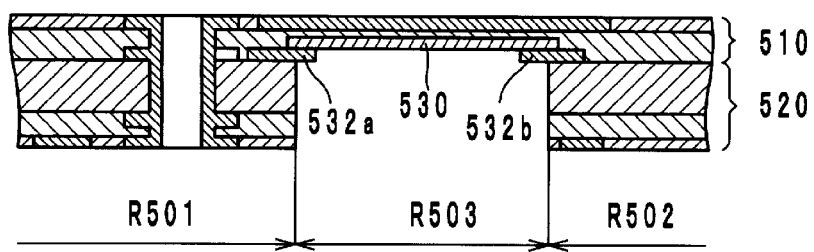
FIG. 14 is a cross-sectional structural view of a printed wiring board described in Japanese Unexamined Patent Application Publication No. 2007-324208.

A circuit board according to a seventh modification of a preferred embodiment of the present invention will be described below with reference to the drawings. FIG. 13 is a cross-sectional structural view of a circuit board 10g according to the seventh modification.

The circuit board 10g further includes grooves G3 to G12, in contrast to the circuit board 10d. More specifically, the grooves G3 and G4 are provided at opposite ends of a line section sheet 31d in the x-axis direction. The groove G5 is adjacent to a negative side of a groove G1 in the x-axis direction, and extends parallel or substantially parallel to the groove G1. The groove G6 is adjacent to a negative side of the groove G5 in the x-axis direction, and extends parallel or substantially parallel to the groove G1. The groove G7 is provided adjacent to a positive side of a groove G2 in the x-axis direction, and extends parallel or substantially parallel to the groove G2. The groove G8 is adjacent to a positive side of the groove G7 in the x-axis direction, and extends parallel or substantially parallel to the groove G2. The groove G9 is adjacent to a negative side of the groove G3 in the x-axis direction, and extends parallel or substantially parallel to the groove G3. The groove G10 is adjacent to a negative side of the groove G9 in the x-axis direction, and extends parallel or substantially parallel to the groove G3. The groove G11 is adjacent to a positive side of the groove G4 in the x-axis direction, and extends parallel or substantially parallel to the groove G4. The groove G12 is adjacent to a positive side of the groove G11 in the x-axis direction, and extends parallel or substantially parallel to the groove G4.

Further, the grooves G1 to G12 are not adjacent to one another. That is, gaps or intervals are provided between the grooves G1 and G12. The circuit board 10g having this structure also more effectively prevents breakage of a line section sheet 31b, and more effectively prevents separation of the line section sheet 31d from a line section sheet 31c. Moreover, the circuit board 10g more effectively prevents separation of substrate section sheets 27a and 29a from substrate section sheets 27b and 29b. That is, the circuit board 10g prevents breakage at boundaries between rigid regions R1 and R2 and a flexible region F1.

In the circuit boards 10 and 10a to 10g, it is preferable that all of the flexible sheets 26a to 26d are flexible. However, in the circuit boards 10 and 10a to 10g, the substrate section sheets 27 and 29 may be partially or entirely formed by an insulating layer having no flexibility.

As described above, preferred embodiments of the present invention are useful for a circuit board, and are superior particularly in an ability to prevent breakage at the boundaries between the rigid regions and the flexible region.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit board comprising:
a body including a plurality of stacked insulating layers and a first region and a second region more flexible than the first region; and
a circuit defined by a conductor provided in the body; wherein
in the second region on a first principal surface of the body, a first groove is arranged to be in contact with a boundary between the first region and the second region and to extend along the boundary;
in the second region on a second principal surface of the body opposite to the first principal surface of the body, a second groove is arranged to be in contact with the boundary between the first region and the second region and to extend along the boundary; and
no grooves are provided in a central portion of the second region on the first principal surface or on the second principal surface of the body.

2. The circuit board according to claim 1, wherein a number of the insulating layers in the first region is larger than a number of the insulating layers in the second region, and a stepped portion is provided at the boundary between the first region and the second region.

3. The circuit board according to claim 1, wherein at least one third groove parallel or substantially parallel to the first groove is provided in the second region on the first principal surface of the body.

4. The circuit board according to claim 3, wherein the at least one third groove includes a plurality of third grooves, the first groove is deeper than the plurality of third grooves, and the plurality of third grooves decrease in depth extending away from the boundary.

5. The circuit board according to claim 1, wherein all of the plurality of insulating layers included in the body are flexible.

6. The circuit board according to claim 1, wherein, in plan view in a layer stacking direction, a ratio of an area occupied by the conductor in the first region is higher than a ratio of an area occupied by the conductor in the second region.

* * * * *